United States Patent
Sato

[19]

[11] Patent Number: 5,998,303
[45] Date of Patent: Dec. 7, 1999

[54] SEMICONDUCTOR DEVICE MAKING METHOD

[75] Inventor: Junichi Sato, Tokyo, Japan

[73] Assignee: Sony Corporation, Tokyo, Japan

[21] Appl. No.: 08/819,727

[22] Filed: Mar. 18, 1997

[30]     Foreign Application Priority Data

Mar. 19, 1996  [JP]  Japan ................................. 8-062250

[51] Int. Cl.⁶ ..................... H01L 21/31; H01L 21/469
[52] U.S. Cl. ..................... 438/758; 438/102; 438/784; 438/623; 438/789; 438/790
[58] Field of Search ................... 438/758, 784, 438/102, 143, 623, 789, 740, 774

[56]            References Cited

U.S. PATENT DOCUMENTS

| | | |
|---|---|---|
| 4,575,464 | 3/1986 | Grain . |
| 5,221,640 | 6/1993 | Sato . |
| 5,227,337 | 7/1993 | Kadomura . |
| 5,451,260 | 9/1995 | Versteeg et al. . |
| 5,700,736 | 12/1997 | Muroyama . |
| 5,750,211 | 5/1998 | Weise et al. . |

FOREIGN PATENT DOCUMENTS 62-30318A  2/1987  Japan .

*Primary Examiner*—John F. Niebling
*Assistant Examiner*—Jonathan Hack
*Attorney, Agent, or Firm*—Hill & Simpson

[57]            ABSTRACT

A method for making a semiconductor device includes:
  a step for preparing a substrate;
  a step for forming a wiring layer on the substrate;
  a step for loading the substrate onto a substrate supporting unit in a reaction chamber;
  a step for supplying a material gas essentially consisting of a silane gas, an oxidizing gas and a chalcogen fluoride gas into the reaction chamber; and
  a step for forming a silicon oxide insulating film containing fluorine on the substrate by a plasma CVD process.

15 Claims, 2 Drawing Sheets

SEMICONDUCTOR DEVICE MAKING METHOD

BACKGROUND OF THE INVENTION

1. Field of the Invention

The present invention relates to methods for making semiconductor devices, and in particular, to a method for making a semiconductor device including a step for forming a silicon oxide insulating film containing fluorine with a low dielectric constant.

2. Description of the Related Art

With progress toward higher integration density in semiconductor device fields such as LSIs, the width of an interlayer insulating film between two adjacent wiring sections formed on a wiring layer in a multilayer wiring configuration has decreased and the thickness of the interlayer insulating film between two wiring layers has also decreased. Such decreases between wiring sections result in increased inter-wiring capacitance. Thus, effective operation speeds of semiconductor devices deviate from the 1/K scaling rule and therefore advantages in a high integration density are offset, wherein K indicates reduction rate. Prevention of increased inter-wiring capacitance is an essential technology to be solved in order to achieve high speed operation of high-integration density semiconductor devices, low electric power consumption, and less heat formation.

Use of a low dielectric material for the interlayer insulating film is effective in decreasing the inter-wiring capacitance of a high integration density semiconductor device as disclosed in, for example, Japanese Unexamined Patent Publication No. 63-7,650. Typical examples of such low dielectric materials include inorganic materials such as a silicon oxide insulating film containing fluorine (hereinafter referred to as SiOF insulating film). Other materials include organo-polymeric materials, such as organic SOG (Spin On Glass) containing siloxane, polyimides, polyparaxylene (commercial name: Parylene, made by Parylene Conformal Coating System, Inc.) and polynaphthalene; and fluorine resins, such as FLARE (commercial name, made by Allied-Signal Inc.), perfluoro polyimides, and poly(fluoroallyl ether). These low dielectric materials are introduced in, for example, page 105 of "Nikkei Microdevice" (issued in July, 1995).

Japanese Unexamined Patent Publication No. 7-3,727 by the applicant of the present invention discloses a monolithic insulating film, which can be used for a semiconductor device having interlayer insulation films with a low dielectric constant and high reliability. That is, a low dielectric material having a relative dielectric constant of no greater than 3.5 is used for adjacent wiring sections and different wiring layers, and each low dielectric material layer is intercalated with insulating films having excellent film characteristics, such as $SiO_2$ (relative dielectric constant: 4) and $Si_3N_4$ (relative dielectric constant: 4 to 6).

Among low dielectric materials, SiOFs can be produced by the same film making process as a conventional inorganic interlayer insulating film and thus using any current production apparatuses. In detail, SiOFs are formed by a process disclosed in Japanese Unexamined Patent Publication No. 6-333,919, in which a fluorosilane gas such as $SiF_4$ is used instead of a material gas for forming the silicon oxide insulating film, such as $SiH_4$, and Si—F bonds are incorporated in the silicon oxide insulating film by CVD. Since $SiH_4$ has a low dissociation rate in plasma, a suitable amount of Si—F bonds are barely incorporated in the silicon-oxide insulating film.

Japanese Unexamined Patent Publication No. 6-295,907 by the applicant of the present invention discloses a method for promoting material gas dissociation in plasma by adding a basic gas such as $NH_3$. Although this method noticeably decreases the hydroxyl group content in the silicon oxide insulating film, it is less effective in decreasing the relative dielectric constant.

As disclosed in Japanese Unexamined Patent Publication No. 7-90,589, use of fluorocarbon gas, e.g. $CF_4$ and $C_2F_6$, as a fluorine atom source decreases the relative dielectric constant, whereas the possibility of contamination due to incorporation of carbon atoms still remains.

SUMMARY OF THE INVENTION

It is an object of the present invention to solve drawbacks in the prior art set forth above.

It is another object of the present invention to provide a method for making a semiconductor device comprising a step for forming a silicon oxide insulating film containing fluorine, which has a sufficiently low relative dielectric constant and is not contaminated due to the added material gas.

A method for making a semiconductor device in accordance with the present invention comprises:
- a step for preparing a substrate;
- a step for forming a wiring layer on the substrate;
- a step for loading the substrate onto a substrate supporting unit in a reaction chamber;
- a step for supplying a material gas essentially consisting of a silane gas, an oxidizing gas and a chalcogen fluoride gas into the reaction chamber; and
- a step for forming a silicon oxide insulating film containing fluorine on the substrate by a plasma CVD process.

A method for making a semiconductor device in accordance with a second aspect of the present invention comprises:
- a step for preparing a substrate;
- a step for loading the substrate onto a substrate supporting unit in a reaction chamber;
- a step for supplying a material gas essentially consisting of a silane gas, an oxidizing gas and a chalcogen fluoride gas into the reaction chamber;
- a step for forming a silicon oxide insulating film containing fluorine on the substrate by a plasma CVD process; and
- a step for forming a wiring layer on the silicon oxide insulating film.

A method for making a semiconductor device in accordance with a third aspect of the present invention comprises:
- a step for preparing a substrate;
- a step for loading the substrate onto a substrate supporting unit in a reaction chamber;
- a step for supplying a material gas essentially consisting of a silane gas, an oxidizing gas and a chalcogen fluoride gas into the reaction chamber;
- a step for forming a silicon oxide insulating film containing fluorine on the substrate by a plasma CVD process;
- a step for forming a groove on the silicon oxide insulating film; and
- a step for forming wiring in the groove.

BRIEF DESCRIPTION OF THE DRAWINGS

Preferred embodiments of the present invention will be described with reference to the accompanying drawings, wherein:

FIG. 1 includes outlined cross-sectional views for illustrating a plasma enhanced CVD process set forth in Examples 1 through 3 in accordance with the present invention, wherein

DESCRIPTION OF THE PREFERRED EMBODIMENTS

Figure 1A:
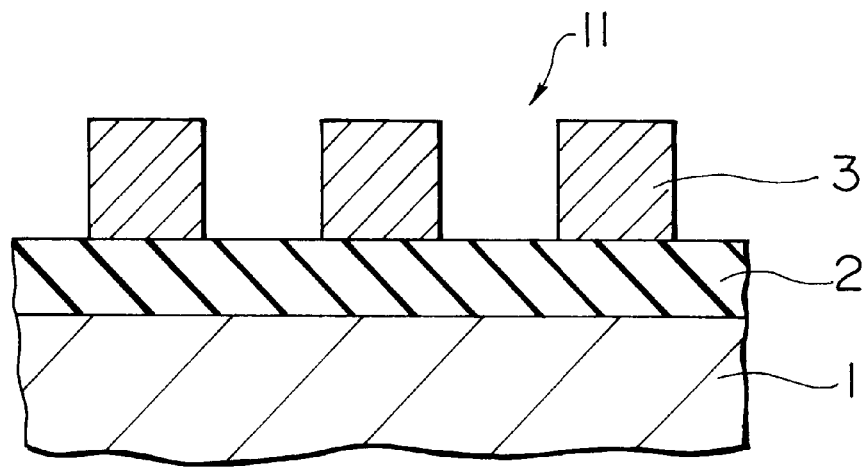
FIG. 1A illustrates a state in which a wiring layer is formed on an interlayer insulating film and FIG. 1B illustrates a state in which a silicon oxide interlayer insulating film having a low dielectric constant is deposited.

A method for making a semiconductor device in accordance with the present invention is characterized in that a silicon oxide insulating film containing fluorine is formed on a substrate to be treated by CVD using a material gas essentially consisting of a silane gas, an oxidizing gas and a chalcogen fluoride gas.

Examples of chalcogen fluorides used in the present invention include $OF_2$ (mp=-233.8° C., bp=-144.8° C.), $S_2F_2$ (mp=-120.5° C., bp=-38.4° C.), $SF_2$ (gaseous at room temperature), $SF_4$ (mp=-121° C., bp=-38° C.), $S_2F_{10}$ (mp=-52.7° C., bp=30° C.), $SeF_4$ (mp=-13.8° C., bp=>100° C.) and $TeF_4$ (bp=>97° C.). These compounds can be used alone or in combination with a plurality of the compounds.

Examples of silane gases used in the present invention include known inorganic silane gases and organic silane gases.

In an embodiment of the present invention, a silicon oxide insulating film containing fluorine is preferably formed while applying ultrasonic waves to a treating substrate.

Operation of the method in accordance with the present invention will now be illustrated.

In the present invention, a compound composed of chalcogen and fluorine is used as a material gas for supplying fluorine during SiOF film formation by CVD. Such a fluorine compound does not contain elements which remain in the SiOF film as contaminants and has excellent dissociation characteristics in plasma. Chalcogen elements, such as O, S, Se and Te, have high vapor pressures, and thus are gaseous or sublimable. Thus, these chalcogen elements will not be included in the SiOF film. If trace amounts of chalcogen elements are trapped in the SiOF film, these can be released from the SiOF film by sublimation during heat treatment after film deposition. Such sublimation can be effectively achieved by heat treatment after planarization of the deposited SiOF film by mechanochemical polishing. If micropores occur due to sublimative release of the chalcogen atoms from the SiOF film, these micropores advantageously affect achievement of a low dielectric constant, because air in micropores has a relative dielectric constant of 1.

An $SF_6$ molecule as a typical chalcogen fluoride generates many F*s (F radicals) by dissociation. Since F*s also act as etchants of the SiOF film, an etching reaction competing against the deposition is noticeable, and thus, the deposition rate is saturated. Therefore, this compound is not preferable in view of throughput.

By applying ultrasonic vibration to the CVD reaction system, the vibration energy of the treating substrate and energy levels of vibration, such as translation and rotation, of the material gas are enhanced, and dissociation of the material gas and migration of reaction intermediates on the treating substrate are activated. Thus, film deposition with excellent step coverage can be effectively achieved at a lower temperature than any conventional processes. A noncontaminated SiOF film can be formed at a practical deposition rate by such an operation.

A similar method for forming a SiO2 film is disclosed in Japanese Unexamined Patent Publication No. 5-44,037, wherein ultrasonic vibration is applied to a substrate supporting member or a reaction space. The process is a thermal decomposition CVD process in an $O_3$/TEOS (tetraethoxysilane) system, and no description is found regarding a noncontaminated silicon oxide insulating film having a low dielectric constant.

The embodiment of the present invention will now be illustrated in more detail with reference to drawings. First, the configuration of the single wafer CVD system used in the embodiment in accordance with the present invention is illustrated with reference to an outlined cross-sectional view set forth in FIG. 2.

Figure 2:
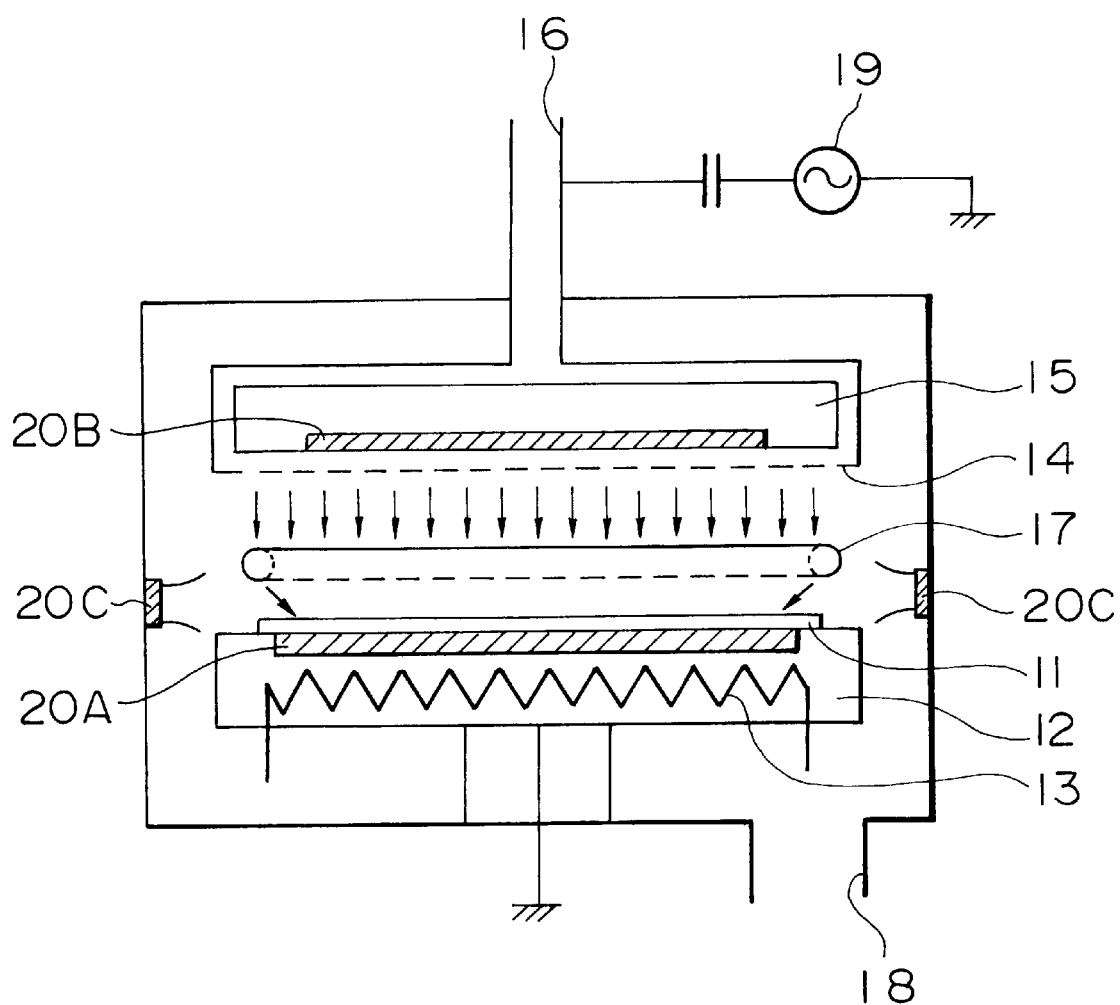
FIG. 2 is a schematic cross-sectional view of a single wafer plasma enhanced CVD system used in Examples 1 through 3 in accordance with the present invention.

FIG. 2 exhibits a diode parallel plate plasma enhanced CVD system. A treating substrate 11, on which a SiOF film is deposited, is placed on a substrate stage 12 with a heater 13 and the substrate stage 12 is grounded. A material gas from a gas inlet 16 is diffused from a gas diffusion plate 15 and exhausted on the treating substrate 11 through a gas shower head 14 which is placed parallel to the treating substrate 11 and has gas exhaust openings made from a porous plate. A hollow circular gas ring 17 having many gas exhaust nozzles is provided at the periphery of the treating substrate 11 and supplies a fraction of the material gas or a dilution gas, if necessary. The apparatus is further provided with a RF power source 19 which supplies RF power to a gas outlet connected to a vacuum pump (not shown in the drawing) and the gas shower head 14 which also acts as an upper electrode. When the gas shower head 14 and the substrate stage 12 are provided upside-down, that is, the treating substrate 11 is held downward (a face down configuration), particle adhesion on the surface of the treating substrate 11 can be prevented.

The plasma enhanced CVD system in accordance with the present invention is characterized by ultrasonic vibration applying means 20A, 20B and 20C. The ultrasonic vibration applying means 20A is installed in the substrate stage 12 in order to directly stimulate the treating substrate 11. The ultrasonic vibration applying means 20B is installed to the gas diffusion plate 15 in order to stimulate the material gas exhausted from the gas shower head 14. The ultrasonic vibration applying means 20B may be installed to the gas shower head 14, the gas inlet 16, or the gas ring 17. The ultrasonic vibration applying means 20C is attached on the inner wall of the CVD chamber in order to stimulate the material gas on the treating substrate 11. The ultrasonic vibration applying means 20C is provided with a horn for enhancing ultrasonic directivity in order to effectively stimulate the material gas in the vicinity of the treating substrate 11. The horn is similar to a horn tweeter used in speaker systems. It is preferable that a plurality of the ultrasonic vibration applying means 20C be provided on the inner wall of the etching chamber. Examples of usable ultrasonic vibration applying means include piezoelectric devices, magnetoresistive devices, electric vibrators comprising a magnetic circuit and a coil, and various electricity/sonic-wave transducers.

EXAMPLE 1

Figure 1B:
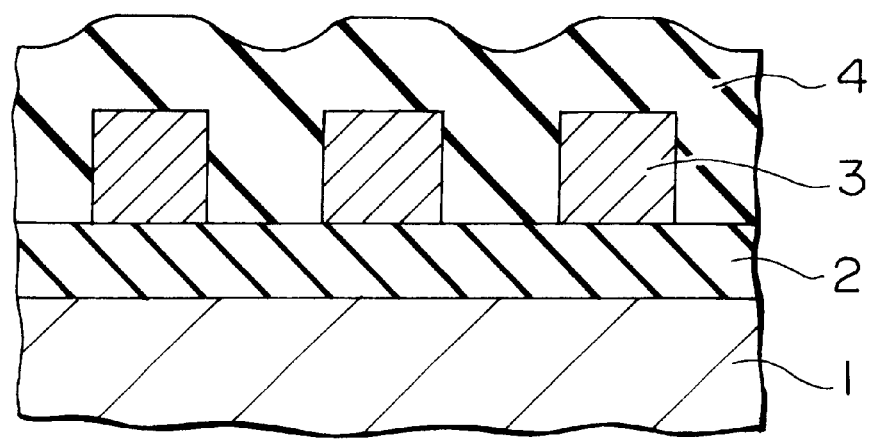

An example of a SiOF film forming process will now be illustrated with reference to FIGS. 1A and 1B, in which an interlayer insulating film of SiOF having a low dielectric constant is formed on a metallic Al wiring pattern by a plasma enhanced CVD process using a material gas composed of $SiH_4$, $O_2$ an $S_2F_2$.

An aluminum wiring layer 3 consisting of line-and-space repeating units each having, for example, a width of 0.35 μm was formed on the interlayer insulating film 2 on a Si substrate. A treating substrate as set forth in FIG. 1A was prepared in such a manner. Next, a thin underlayer insulating film (not shown in the drawings) was conformally formed by general plasma enhanced CVD using $SiH_4$ and $N_2O$ source gases, according to demand. Although the thin underlayer insulating film was formed to improve the SiOF film quality deposited in the following step, the film deposition process can be omitted, if not necessary.

The treating substrate 11 was loaded on the substrate stage in the CVD system set forth in FIG. 2, and a SiOF film was deposited by plasma enhanced CVD under the following conditions:

| | |
|---|---|
| $SiH_4$ flow rate: | 50 sccm |
| $O_2$ flow rate: | 50 sccm |
| $S_2F_2$ flow rate: | 30 sccm |
| Gas pressure: | 27 Pa |
| RF power: | 0.08 W/cm$^2$ (13.56 MHz) |
| Substrate temperature: | 300° C. |

The SiOF film was deposited until the thickness reached 0.3 μm on the Al wiring pattern. As a result, an interlayer insulating film 4 with no carbon or sulfur contaminants having excellent step coverage could be deposited at a practical deposition rate as set forth in FIG. 1B. The resulting interlayer insulation film 4 had a relative dielectric constant of 3.3. The protruding sections of the interlayer insulating film 4 may be planarized by mechanochemical polishing in this step, if necessary.

A thin topcoat insulating film (not shown in the drawing) may be deposited on the interlayer insulating film 4 by general plasma enhanced CVD using $SiH_4$ and $N_2O$ source gasses, according to demand. A highly reliable interlayer insulating film having excellent humidity resistance and a low relative dielectric constant can be achieved by such a monolithic structure.

EXAMPLE 2

The deposition process in Example 2 was identical to Example 1, except that $OF_2$ was used instead of $S_2F_2$. A SiOF interlayer insulating film 4 having a relative dielectric constant of 3.3 was deposited with excellent step coverage and no contamination.

EXAMPLE 3

The deposition process in Example 3 was identical to Example 1, except that $SF_4$ was used instead of $S_2F_2$ and the SiOF film was deposited while applying ultrasonic waves to the treating substrate. The treating substrate used was the same as that used in Example 1. The treating substrate 11 was loaded on the substrate stage 12 in the CVD system set forth in FIG. 2, and the SiOF film was deposited by CVD under the following conditions. Ultrasonic vibration was applied using the ultrasonic vibration applying means 20A installed to the substrate stage 12. The stimulating electric power was 100 W, but its optimal value varied with the diameter and weight of the treating substrate 11, and efficiency of the electric/sonic-wave transducer.

| | |
|---|---|
| $SiH_4$ flow rate: | 50 sccm |
| $O_2$ flow rate: | 50 sccm |
| $SF_4$ flow rate: | 30 sccm |
| Gas pressure: | 27 Pa |
| RF power: | 0.08 W/cm$^2$ (13.56 MHz) |
| Consecutive ultrasonic vibration: | 100 W (200 kHz) |
| Substrate temperature: | 300° C. |

The SiOF film was deposited until the thickness reached 0.3 μm on the Al wiring pattern. As a result, an interlayer insulating film 4 with no carbon or sulfur contaminants having excellent step coverage could be deposited at a practical deposition rate as set forth in FIG. 1B. The relative dielectric constant of the resulting interlayer insulation film 4 was further improved to 3.2, because dissociation of $SF_4$ was promoted by ultrasonic wave application and thus fluorine atoms were effectively included in the film.

EXAMPLE 4

The deposition process in Example 4 was identical to Example 1, except that $SeF_4$ was used instead of $S_2F_2$ and the SiOF film was deposited while applying ultrasonic waves to the material gas exhausted from the gas shower head 14 in order to endow both the plasma space and the treating substrate with ultrasonic vibration energy.

The treating substrate used was the same as that used in Example 1. The treating substrate 11 was loaded on the substrate stage 12 in the CVD system set forth in FIG. 2, and the SiOF film was deposited by CVD under the following conditions. Ultrasonic vibration were applied using the ultrasonic vibration applying means 20B installed to the gas diffusion plate 15 in the gas shower head 14. The stimulating electric power was 100 W, but its optimal value varied with the diameter and weight of the gas diffusion plate 15, efficiency of the electric/sonic-wave transducer and gas flow rates.

| | |
|---|---|
| $SiH_4$ flow rate: | 50 sccm |
| $O_2$ flow rate: | 50 sccm |
| $SeF_4$ flow rate: | 30 sccm |
| Gas pressure: | 27 Pa |
| RF power: | 0.08 W/cm$^2$ (13.56 MHz) |
| Consecutive ultrasonic vibration: | 100 W (200 kHz) |
| Substrate temperature: | 400° C. |

The SiOF film was deposited until the thickness reached 0.3 μm on the Al wiring pattern. As a result, an interlayer insulating film 4 with no carbon or sulfur contaminants having excellent step coverage could be deposited at a practical deposition rate as set forth in FIG. 1B. The relative dielectric constant of the resulting interlayer insulation film 4 was further improved to 3.2, because dissociation of $SeF_4$ was promoted by ultrasonic wave application and thus fluorine atoms were effectively included in the film. The substrate may be planarized by eliminating protruding sections of the interlayer insulating film 4 by a mechanochemical polishing means in this step. A trace amount of selenium remaining in the interlayer insulating film may be removed by sublimation with heat.

The Examples set forth above are to illustrate and not to limit the present invention.

Any chalcogen fluorides, other than $S_2F_2$, $OF_2$, $SF_4$ and $SeF_4$ exemplified above, can be used in the present invention.

Although $SiH_4$ is used as a silane gas in the Examples, higher inorganic silane gases such as $Si_2H_6$ can be used.

Alternatively, organic silane gases, e.g. octamethylcyclotetrasiloxane (OMCTS), tetrapropoxysilane (TPOS), tetramethylcyclotetrasiloxane (TMCTS), tetramethylorthosilicate (TMOS), diacetoxyditertialybutoxysiliane (DADBS), tetraethylsilane (TES) and tetramethylsilane (TMS), may be used. Further, these organic silane gases may be used with inorganic silane gases, such as $SiH_4$ and $Si_2H_6$.

Although $O_2$ as used as an oxidizing gas in the Examples set forth above, other oxidizing gases, e.g. $O_3$, $N_2O$, $NO_2$, $H_2O$ and $H_2O_2$, may be used alone or in combination. Dilution gases, such as rare gases, e.g. He, Ar and Xe, and other gases, e.g. $N_2$ may also be used alone or in combination, if necessary.

An ultrasonic vibration applying means 20C directly installed on the chamber wall may be used instead of the ultrasonic vibration applying means 20A installed to the substrate stage 12 or the ultrasonic vibration applying means 20B installed to the gas diffusion plate 15. Ultrasonic waves can be intermittently applied, and any frequencies other than 200 kHz can also be used in the present invention. Further, a plurality of frequencies can be applied in order, or the frequency and the power can be swept during application.

Any high density plasma sources other than the dipole parallel plate plasma enhanced CVD system set forth above, such as a microwave plasma enhanced CVD system, an ECR plasma enhanced CVD system, a helicon plasma enhanced CVD system and an inductive coupled plasma enhanced CVD system, can be used in the present invention. Use of UV light sources, e.g. a low pressure Hg lamp is effective in promotion of material gas dissociation and suppression of substrate damage. LP-CVD or normal pressure CVD is also applicable if no Al wiring pattern is present under the SiOF film. In this case, an ultrasonic vibration applying means may be installed to the substrate stage or nozzle or on the chamber wall of the CVD system used, according to demand.

Although an interlayer insulating film was deposited on an Al wiring pattern in the Examples set forth above, other wiring materials may be used. Further the insulating film may be used as a final passivation film. Moreover, the method in accordance with the present invention can be applied so long as a trench isolator is flat embedded with no void formation.

As set forth above, a SiOF film with no carbon or sulfur contamination having a low dielectric constant can be deposited at a practical deposition rate by a method in accordance with the present invention. Therefore, semiconductor devices, such as microprocessors and high density memories without signal delay due to increased inter-wiring capacitance can be produced with high reliability.

What is claimed is:

1. A method for making a semiconductor device comprising:
    a step of preparing a substrate;
    a step of forming a wiring layer on said substrate;
    a step for loading said substrate into a substrate supporting unit in a reaction chamber;
    a step for supplying a material gas essentially consisting of a silane gas, an oxidizing gas and a gas consisting of at least one gas selected from the group consisting of $OF_2$, $S_2F_2$, $SF_2$, $SF_4$, $S_2F_{10}$, $SeF_4$ and $TeF_4$ into the reaction chamber; and
    a step for forming a silicon dioxide insulating film containing fluorine on said substrate by a CVD process.

2. A method for making a semiconductor device according to claim 1, wherein said silane gas is at least one gas selected from inorganic silane gases and organic silane gases.

3. A method for making a semiconductor device according to claim 1, wherein said method further comprises a step for applying ultrasonic vibration to said substrate by means of an ultrasonic vibrating means provided on said substrate supporting unit.

4. A method for making a semiconductor device according to claim 1, wherein said method further comprises a step for applying ultrasonic vibration to said substrate and said material gas by means of an ultrasonic vibrating means provided on the inner wall of said reaction chamber.

5. A method for making a semiconductor device according to claim 1, wherein said method further comprises a step for applying ultrasonic vibration to said substrate and said material gas by means of an ultrasonic vibrating means provided on a material gas supplying means for supplying said material gas to said reaction chamber.

6. A method for making a semiconductor device comprising:
    a step of preparing a substrate;
    a step for loading said substrate into a substrate supporting unit in a reaction chamber;
    a step for supplying a material gas essentially consisting of a silane gas, an oxidizing gas and a gas consisting of at least one gas selected from the group consisting of $OF_2$, $S_2F_2$, $SF_2$, $SF_4$, $S_2F_{10}$, $SeF_4$ and $TeF_4$ into said reaction chamber;
    a step for forming a silicon dioxide insulating film containing fluorine on said substrate by a CVD process; and
    a step of forming a wiring layer on said silicon dioxide insulating film.

7. A method for making a semiconductor device according to claim 6, wherein said silane gas consists of at least one gas selected from inorganic silane gases and organic silane gases.

8. A method for making a semiconductor device according to claim 6, wherein said method further comprises a step for applying ultrasonic vibration to said substrate by means of an ultrasonic vibrating means provided on said substrate supporting unit.

9. A method for making a semiconductor device according to claim 6, wherein said method further comprises a step for applying ultrasonic vibration to said substrate and said material gas by means of an ultrasonic vibrating means provided on the inner wall of said reaction chamber.

10. A method for making a semiconductor device according to claim 6, wherein said method further comprises a step for applying ultrasonic vibration to said substrate by means of an ultrasonic vibrating means provided on a material gas supplying means for supplying said material gas to said reaction chamber.

11. A method for making a semiconductor device comprising:
    a step of preparing a substrate;
    a step for loading said substrate into a substrate supporting unit in a reaction chamber;
    a step for supplying a material gas essentially consisting of a silane gas, an oxidizing gas and a gas consisting of at least one gas selected from the group consisting of $OF_2$, $S_2F_2$, $SF_2$, $SF_4$, $S_2F_{10}$, $SeF_4$ and $TeF_4$ into said reaction chamber;
    a step for forming a silicon dioxide insulating film containing fluorine on said substrate by a CVD process;

a step of forming a groove on said silicon oxide insulting film; and a step of forming a wiring layer in said groove.

12. A method for making a semiconductor device according to claim 11, wherein said silane gas consists of at least one gas selected from inorganic silane gases and organic silane gases.

13. A method for making a semiconductor device according to claim 11, wherein said method further comprises a step for applying ultrasonic vibration to said substrate by means of an ultrasonic vibrating means provided on said substrate supporting unit.

14. A method for making a semiconductor device according to claim 11, wherein said method further comprises a step for applying ultrasonic vibration to said substrate and said material gas by means of an ultrasonic vibrating means provided on the inner wall of said reaction chamber.

15. A method for making a semiconductor device according to claim 11, wherein said method further comprises a step for applying ultrasonic vibration to said substrate and said material gas by means of an ultrasonic vibrating means provided on a material gas supplying means for supplying said material gas to said reaction chamber.

* * * * *